United States Patent
Dixit et al.

(10) Patent No.: US 7,797,596 B2
(45) Date of Patent: Sep. 14, 2010

(54) METHOD FOR MONITORING AND ADJUSTING CIRCUIT PERFORMANCE

(75) Inventors: Anand Dixit, Mountain View, CA (US); Raymond A. Heald, Los Altos, CA (US); Steven R. Boyle, Santa Clara, CA (US)

(73) Assignee: Oracle America, Inc., Redwood City, CA (US)

( * ) Notice: Subject to any disclaimer, the term of this patent is extended or adjusted under 35 U.S.C. 154(b) by 165 days.

(21) Appl. No.: 11/861,403

(22) Filed: Sep. 26, 2007

(65) Prior Publication Data

US 2009/0083598 A1 Mar. 26, 2009

(51) Int. Cl.
*G11C 29/00* (2006.01)
(52) U.S. Cl. .......................... 714/721; 714/733; 714/1; 714/33; 714/704; 714/718; 714/723; 714/724; 714/734; 714/736; 714/741; 714/745; 702/89; 702/117; 365/201; 365/154
(58) Field of Classification Search ....................... None
See application file for complete search history.

(56) References Cited

U.S. PATENT DOCUMENTS 6,541,285 B2 * 4/2003 Koike ........................... 438/14

(Continued)

FOREIGN PATENT DOCUMENTS

| EP | 1 818 676 A | 8/2007 |
|----|-------------|--------|
| EP | 1818676 A1 * | 8/2007 |
| WO | 2004/077081 A | 9/2004 |

(Continued)

OTHER PUBLICATIONS

Tschanz, et al, "Dynamic Sleep Transistor and Body Bias for Active Leakage Power Control of Microprocessors," IEEE Journal of Solid-State Circuits, vol. 38, No. 11, Nov. 2003.

(Continued)

*Primary Examiner*—John P Trimmings
(74) *Attorney, Agent, or Firm*—Meyertons, Hood, Kivlin, Kowert & Goetzel, P.C.; Erik A. Heter

(57) ABSTRACT

A method for testing an integrated circuit implemented in an electronic system. The method includes placing an integrated circuit (or portion thereof) that is implemented in an operational system (e.g., in a computer system) in an offline status. An electrical parameter of the integrated system (e.g., a voltage, clock frequency, etc.) is set, and a built-in self-test (BIST) is conducted. Any failures that occur during the BIST are recorded. Testing is then repeated for each of a plurality of predetermined values of the electrical parameter, recording any failures that occur. Once testing is complete a failure rate/range is determined for each of the predetermined values.

14 Claims, 4 Drawing Sheets

U.S. PATENT DOCUMENTS

| | | |
|---|---|---|
| 6,795,788 B2 * | 9/2004 | Thatcher et al. ............. 702/119 |
| 7,065,676 B1 * | 6/2006 | Lang et al. .................... 714/33 |
| 7,249,301 B2 * | 7/2007 | Perner ........................ 714/733 |
| 2005/0062491 A1 * | 3/2005 | Burns et al. ................. 324/763 |
| 2005/0099202 A1 * | 5/2005 | Houston et al. ............. 324/765 |
| 2007/0297254 A1 * | 12/2007 | Rosal et al. ................. 365/201 |
| 2008/0036487 A1 * | 2/2008 | Bradley et al. ............. 324/765 |
| 2008/0040089 A1 * | 2/2008 | Beyene et al. ................ 703/14 |
| 2008/0062746 A1 * | 3/2008 | Loh et al. ................... 365/154 |
| 2008/0141072 A1 * | 6/2008 | Kalgren et al. ............... 714/33 |

FOREIGN PATENT DOCUMENTS

WO    WO 2004077081 A1 *   9/2004

OTHER PUBLICATIONS

Narendra, et al, "Forward Body Bias for Microprocessors in 130-nm Technology Generation and Beyond," IEEE Journal of Solid-State Circuits, vol. 38, No. 5, May 2003.

International Search Report and Written Opinion of the International Searching Authority mailed Dec. 16, 2008 for International Application No. PCT/US2008/077511 filed Sep. 24, 2008.

* cited by examiner

METHOD FOR MONITORING AND ADJUSTING CIRCUIT PERFORMANCE

BACKGROUND OF THE INVENTION

1. Field of the Invention

This invention relates to electronic circuits, and more particularly, to the monitoring and adjusting of circuit performance over the life of an electronic circuit.

2. Description of the Related Art

Over the past several decades, scaling of integrated circuits (IC's) has kept pace with Moore's Law, which states that the number of transistors on an IC doubles approximately every two years. As the number of transistors on an IC has increased, the size of the transistors has shrunk accordingly. While such integration has provided significant gains in performance per unit cost, other problems associated with higher levels of integration have occurred.

As the size of transistor features in IC's has decreased, non-idealities have begun to lessen the amount of control over individual devices. Furthermore, the reduced size has made transistors more susceptible to degradation mechanisms. Two common degradation mechanisms are hot carrier effects and negative bias temperature instability (NBTI, for PMOS devices; positive bias temperature instability, or PBTI, exists for NMOS transistors).

Hot carrier affects occur when "carriers" (either holes or electrons) gain a very high amount of kinetic energy after being accelerated by a strong electric field in areas of high field intensities in a MOS device. As a result of this high kinetic energy, hot carriers are injected and trapped in certain areas of the device, thereby forming a space charge that eventually degrades device operation and causes instability.

For NBTI, a positive charge accumulates in the channel interface of a PMOS transistor during high temperature conditions under a negative bias. This in turn results in an increase in the threshold voltage magnitude and a decrease, over time, of the drain saturation current. These effects eventually result in device instability and performance degradation of the PMOS device. PBTI is similar to NBTI, but occurs on an NMOS transistor under positive bias conditions.

At the features sizes of transistors in current IC technology, these degradation mechanisms cannot be ignored. Over time, these degradation mechanisms may impact IC performance by increasing power dissipation, reducing operating speed and/or voltage margin, irregular timing changes, and eventual failure.

SUMMARY OF THE INVENTION

A method for testing an integrated circuit implemented in an electronic system is disclosed. In one embodiment, the method includes placing an integrated circuit (or a portion thereof) that is implemented in an operational system (e.g., in a computer system) in an offline status. An electrical parameter of the integrated system (e.g., a voltage, clock frequency, etc.) is set, and a built-in self-test (BIST) is conducted. Any failures that occur during the BIST are recorded. Testing is then repeated for each of a plurality of predetermined values of the electrical parameter, recording any failures that occur. Once testing is complete a failure rate and a passing range is determined for each of the predetermined values.

In one embodiment, the integrated circuit includes one or more PMOS devices, and the electrical parameter is an n-well voltage. Testing is conducted by performing the BIST at a plurality of different n-well voltages, determining the failure rate for each. The method may further include determining, based on the test results, the n-well voltage at which the integrated circuit is to operate subsequent to testing.

Embodiments that include one or more NMOS devices are also possible and contemplated. In such embodiments, the electrical parameter may be a substrate voltage. CMOS embodiments are contemplated as well, with one or both of the electrical parameters being varied.

Other electrical parameters that may be varied during the repeated conducting of the BIST include (but are not limited to) clock frequencies, supply voltages, and so forth. The integrated circuit may include logic circuits, memory circuits, or both, and may be configured accordingly to conduct a logic BIST and/or a memory BIST. Some embodiments of the integrated circuit may include analog and/or mixed-signal circuitry, and thus the integrated circuit may thus be configured to conduct an AMBIST (analog/mixed-signal BIST).

In various embodiments, the method disclosed herein may allow predicting a time to failure for the integrated circuit or of the particular block of the integrated circuit subject to the test. By predicting a time to failure, a costly failure may be avoided, as the IC may be replaced before the predicted failure actually occurs. Furthermore, data used to predict the time to failure may also be useful in extending the life of the IC by enabling certain parameters to be adjusted to an operating point having a longer time to failure than that of a previous operating point.

BRIEF DESCRIPTION OF THE DRAWINGS

Other aspects of the invention will become apparent upon reading the following detailed description and upon reference to the accompanying drawings in which.

Figure 1:
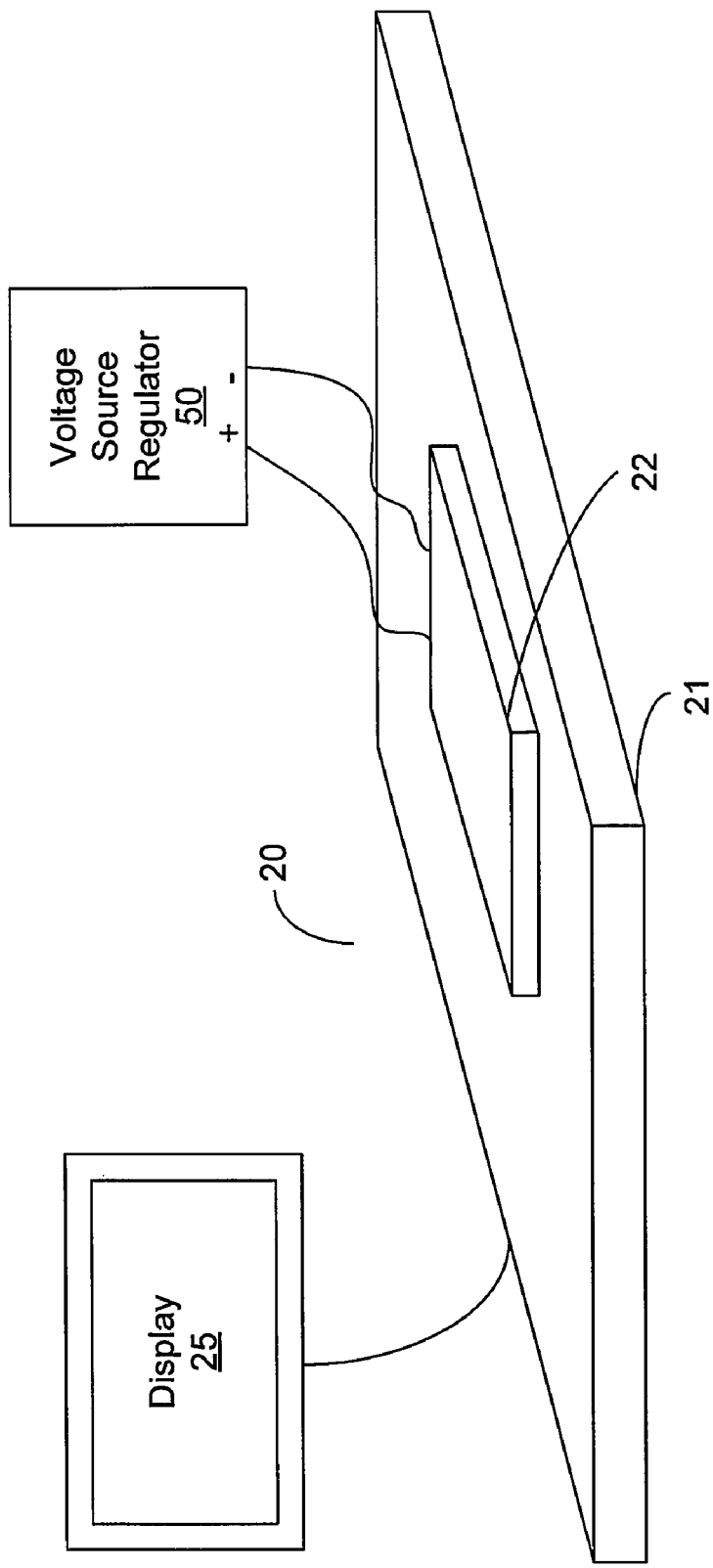
FIG. 1 is a drawing of one embodiment of an electronic system in a configuration for testing in accordance with the present disclosure.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a drawing of one embodiment of an electronic system in a configuration for testing is shown. In the embodiment shown, electronic system 20 includes at least a printed circuit board (PCB) 21 having an integrated circuit (IC) 22 mounted thereupon. It should be noted that electronic system 20 may include numerous other components that are not shown here for the sake of simplicity. Electronic system 20 may be a system that is already in the field (i.e., post manufacture and sale).

IC 22 may include a plurality of devices (i.e. transistors), which may be NMOS devices, PMOS devices, or both if IC 22 is a CMOS IC. The various devices implemented on the die of IC 22 may make up various functional units such as processing circuitry, interface circuitry, memory space, and so forth. IC 22 also includes built-in self-test (BIST) circuitry for conducting tests of the various functional units thereof. The various BIST circuitry of IC 22 may include logic BIST circuitry, memory BIST circuitry, and analog/mixed-signal BIST circuitry, among other types.

In the example shown, a display 25 and a voltage source/regulator 50 are coupled to IC 22 of electronic system 20. Other types of test equipment (e.g., a frequency generator) may also be coupled to IC 22 (and electronic system 20 in general). Testing that requires changing a clock frequency may also be conducted by changing the settings of clock divider and/or clock multiplier circuitry implemented on IC 22, in lieu of using an external frequency generator.

Electronic system 20 is configured for allowing its various components, including IC 22, to be taken offline to conduct testing. The type of testing conducted when a component (or portion of the component; e.g., one or more functional blocks of the component) is offline includes testing wherein an electrical parameter is set to a predetermined value by the attached test equipment and a BIST is performed. For example, for testing circuitry that includes a number of PMOS devices, repeated runs of a BIST may be conducted with different values of an n-well voltage, which may be set by voltage source/regulator 50. In another example, repeated runs of a BIST may be conducted with different values of a substrate voltage for testing circuitry that includes a number of NMOS devices.

Testing involving the variation of other electrical parameters is also possible and contemplated. The various electrical parameters may include supply voltage, clock frequencies, and any other electrical parameter that can be tested and may affect operation of electronic system 20. This type of testing may be repeated for a number of electrical values. The results from each the tests may be used to determine various characteristics of IC 22, and may be able to predict probable times of failure. The information gathered from this type of testing may also be used to determine electrical parameter adjustments that can be made to components of an electronic system (such as IC 22) in order to extend its operating life.

Figure 2:
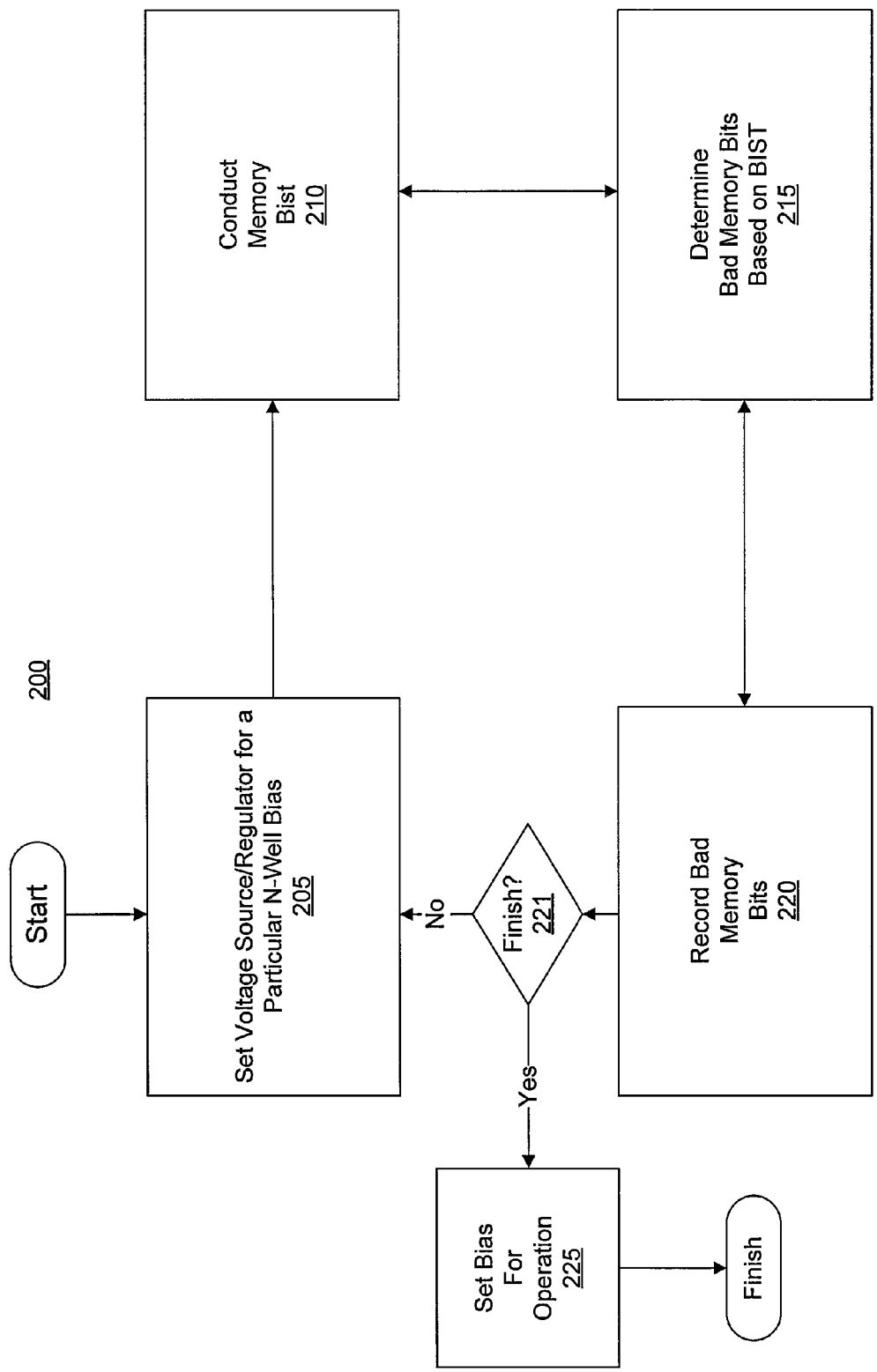
FIG. 2 is a drawing illustrating a process flow for one embodiment of method of testing an integrated circuit.

FIG. 2 is a drawing illustrating a process flow for one embodiment of method of testing an integrated circuit. In the embodiment shown, method 200 is directed to testing memory circuitry having a plurality of PMOS devices. The method begins with the setting of a voltage source/regulator to provide a predetermined value of an n-well voltage for the PMOS devices (205). After setting the value of the n-well voltage, a memory BIST (MBIST) is conducted (210). From the conducting of the MBIST, bad bits (or bit locations) of the memory, if present, are determined (215). Any bit locations determined to be bad by the MBIST are then recorded (220). After completing this cycle, a determination is made as to whether all MBISTs have been completed (221). If another MBIST is to be conducted (221, No), the method returns to 205 and sets the n-well bias to a new value, and then repeats the cycle. The cycle may be repeated for a number of different n-well voltage values. If all MBISTs have been completed (221, Yes), the n-well bias value for operation is set (225). The n-well bias value may be set based on the MBIST failure rate, as well as a range of n-well bias values (i.e. a passing range) for which MBIST passed.

During each cycle, the number of bit failures and the passing range are recorded and stored. This information may reveal potential likelihood of future failures. The information may further indicate potential adjustments that can be made to the n-well voltage in order to extend the operating life of IC 22.

Table 1 below is an example of how information gathered from the method of FIG. 2 can be used. The information is arranged for a number of different n-well voltage values, and predicts the number of bit fails for a various times in the future.

TABLE 1

| $V_{n\text{-}well}$ variation | 0 years | 2 years | 4 years | 6 years | 8 years |
| --- | --- | --- | --- | --- | --- |
| −20% | 0 | 0 | 0 | 0 | 0 |
| −10% | 0 | 0 | 0 | 0 | 0 |
| 0 | 0 | 0 | 0 | 0 | 0 |
| +10% | 0 | 0 | 0 | 0 | 1 |
| +20% | 0 | 0 | 0 | 1 | 2 |
| +30% | 0 | 0 | 1 | 2 | 5 |
| +40% | 0 | 1 | 2 | 5 | 7 |
| +50% | 0 | 2 | 5 | 7 | 10 |

In Table 1, the example information presented corresponds with failure rates observed during the conducting of the BIST at different times, i.e. at shipment (0 years), 2 years after shipment, 4 years after shipment, and so forth. For instance, the example shows that 2 bit fails occur at 2 years for operation of the IC with the n-well voltage 50% above nominal value, which is indicative of a higher failure rate observed by the BIST than the single failure occurring at 2 years when operating at 40% above the nominal n-well voltage, and so forth.

Using the information exemplified by Table 1, a failure while operating under nominal conditions (i.e. at 0 variation of the n-well voltage) can be predicted to occur at approximately 10 years from the time the integrated circuit was originally shipped. Based on the predicted failure at 10 years for nominal operating conditions, a call to service the system can be scheduled to occur sometime prior to the predicted failure. Alternatively (or in addition), the electrical parameter for which the test was conducted (the n-well voltage in this case) can be adjusted to operate at −10% (to operate another two years) or −20% (to operate another four years) in order to extend the life of the part, based on the pattern of losing approximately 10% of the operating margin every two years (assuming all other margins are acceptable).

Another use of the information exemplified by Table 1 may result in the utilization of one or more redundant functional blocks. For example, many memory arrays implemented on integrated circuits are accompanied by redundant memory arrays, in case of failures in the other (primary) memory array. Thus, based on the results from testing at various points in time, locations in the redundant array may be used instead of their counterparts in the primary array where failures have occurred or where operating margin has shown a significant decrease. If necessary, fuse repairs may be conducted to replace the failing locations with the redundant memory locations. Alternatively, portions of the memory that are failing or have significantly reduced operating margins (that may result in soft failures) can be marked as faulty, resulting in those areas not being used.

Figure 3:
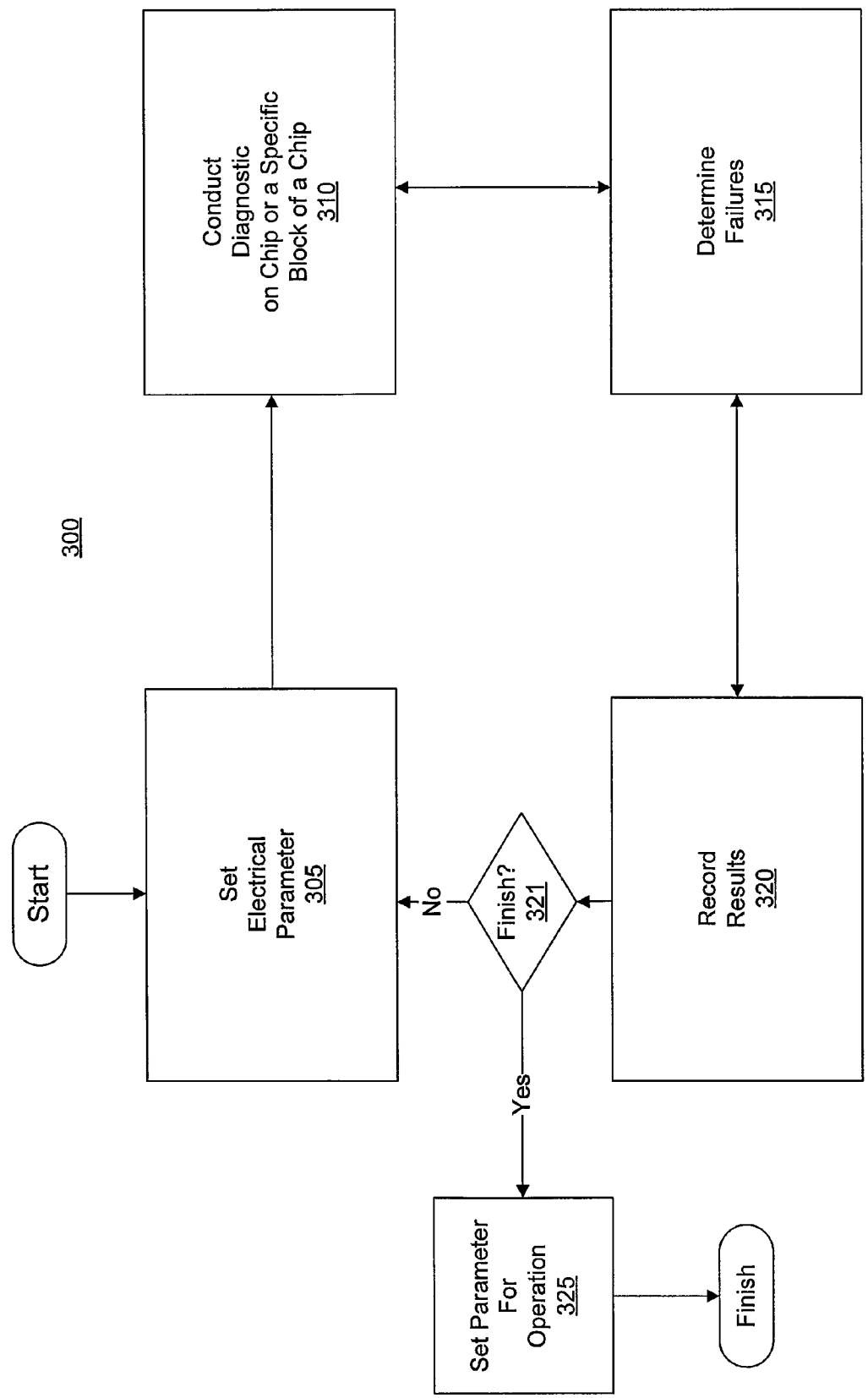
FIG. 3 is a drawing illustrating a process flow for another embodiment of method of testing an integrated circuit.

FIG. 3 is a drawing illustrating a process flow for another embodiment of method of testing an integrated circuit. More particularly, FIG. 3 illustrates a generalized version of the method discussed in FIG. 2.

Method 300 begins with the setting of an electrical parameter (305) for an IC or for a specific functional block within an IC. The electrical parameter may be the n-well voltage as discussed above, a substrate voltage, a supply voltage, a clock frequency, or any other electrical parameter that can be adjusted.

The method then conducts diagnostic test on the IC or the specific block thereof (310). In some embodiments, the testing may comprise performing a BIST. Depending on the type of circuitry within the IC or the specific block thereof, the BIST may be a logic BIST (LBIST), a memory BIST (MBIST), or an analog/mixed-signal BIST (AMBIST). Testing utilizing external means instead of a BIST is also possible and contemplated.

The determination of failures (315), if any, is performed as a result of the conducting of the diagnostic test. These failures are then recorded (320) and saved for future use. The recording of failures may also include organizing the test failure data in order to obtain additional information (e.g., such as the arrangement shown in Table 1, which enables the prediction of future failures). If the method has not completed all testing (321, No), it returns to the beginning, setting the electrical parameter and repeating the process. If all testing has been completed (321, Yes), the method then sets the electrical parameter for operation (325). The parameter may be set based on the BIST failure rates as well as a range of values of the parameter at which the BIST passed (i.e. a passing range).

Figure 4:
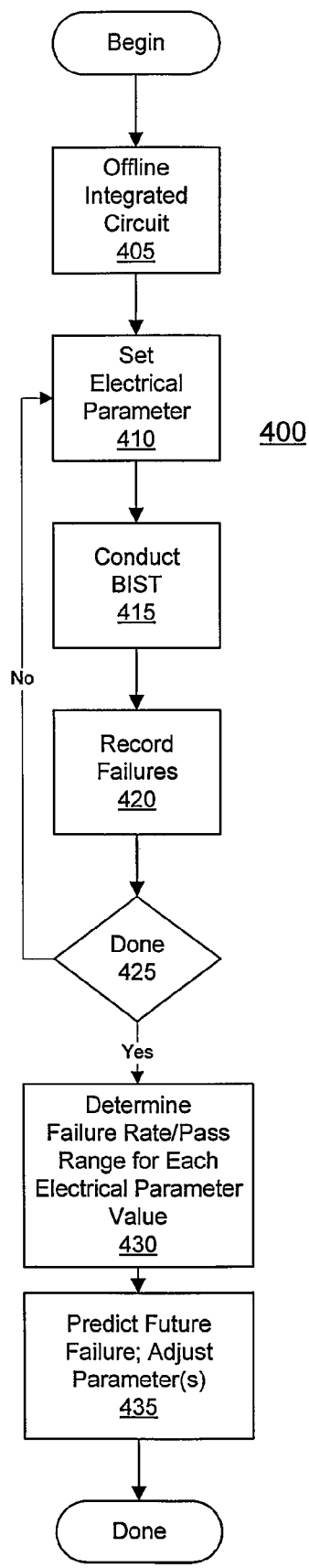
FIG. 4 is a flow diagram illustrating one embodiment of testing an integrated circuit.

FIG. 4 is a flow diagram illustrating one embodiment of testing an IC. The method begins with taking the IC (or at least a portion of the IC, e.g., a functional block therein, such as a memory, logic circuitry, and/or analog/mixed-signal circuitry) offline in an otherwise operational system (block 405). Blocks 410, 415, and 420 are similar to those steps discussed above in regard to FIGS. 2 and 3. Subsequent to block 420, the method may determine whether testing is done. If testing has not completed (block 425, no), then the method returns to block 410. After completion of several number of cycles of steps 404-420 (block 425, yes), method 400 then determines a failure rate for each electrical parameter value for which testing was conducted (block 430). As previously noted, the electrical parameter values may include n-well voltages, substrate voltages, and so forth. Based on the failure rates for each of the electrical parameter values, future failures may be predicted and/or parameters for subsequent operation of the IC may be adjusted (block 435). The future failures may be predicted based on the BIST failure rates, predetermined optimum operating conditions, or both. The optimum operating conditions may be defined by various values such as operating frequency, voltage margins, power usage, and so forth.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for testing an integrated circuit implemented in an electronic system, the method comprising:
    placing one or more functional blocks of the integrated circuit into an offline status;
    setting an electrical parameter of the one or more functional blocks of the integrated circuit to a first of a plurality of predetermined values;
    conducting a built-in self-test (BIST) of the one or more functional blocks of the integrated circuit;
    recording any failures that occur while performing the BIST;
    repeating said setting, said conducting, and said recording for each remaining one of the plurality predetermined values of the electrical parameter;
    determining a failure rate and a passing range for the BIST for each of the predetermined values;
    predicting, for each of the plurality of predetermined values of the electrical parameter, a point in time at which the one or more functional blocks of the integrated circuit will fail based on the failure rates of the BIST; and
    determining a new value of the electrical parameter at which the one or more functional blocks of the integrated circuit is to operate based on at least one of the failure rate and the passing range for the BIST.

2. The method as recited in claim 1, wherein the integrated circuit includes one or more PMOS (p-channel metal oxide semiconductor) devices, and wherein the electrical parameter is an n-well voltage.

3. The method as recited in claim 1, wherein the integrated circuit includes one or more NMOS (n-channel MOS) devices, and wherein the electrical parameter is a substrate voltage.

4. The method as recited in claim 1, wherein the BIST is a memory BIST, and wherein the integrated circuit comprises a memory.

5. The method as recited in claim 1, wherein the integrated circuit includes logic circuitry, and wherein the BIST is a logic BIST.

6. The method as recited in claim 1, wherein the electrical parameter is a clock frequency at which the integrated circuit operates, wherein the plurality of predetermined values of the electrical parameter comprise a plurality of different clock frequencies.

7. The method as recited in claim 6, further comprising coupling a frequency generator to the integrated circuit, wherein the plurality of different clock frequencies are provided by the frequency generator.

8. The method as recited in claim 6, wherein generating each of the plurality of different clock frequencies includes changing settings for one or more of a clock divider and a clock multiplier.

9. A method for testing an integrated circuit implemented in an electronic system, the method comprising:
    placing one or more functional blocks of the integrated circuit into an offline status, wherein the one or more functional blocks of integrated circuit includes one or more PMOS (p-channel metal oxide semiconductor) devices;
    setting an n-well voltage for the one or more PMOS devices to a first of a plurality of predetermined values;
    conducting a built-in self-test (BIST) on the one or more functional blocks of the integrated circuit;
    recording any failures that occur while performing the BIST;
    repeating said setting, said conducting, and said recording for each remaining one of the plurality predetermined values of the n-well voltage;
    determining a failure rate and a passing range for the BIST for each of the plurality of predetermined values;
    predicting, for each of the predetermined values, a point in time at which the one or more functional blocks of the integrated circuit will fail based on the failure rates; and
    determining at which of the plurality of predetermined values of the n-well voltage the one or more functional blocks of the integrated circuit is to operate subsequent to testing, based on the failure rates.

10. The method as recited in claim 9, wherein the integrated circuit includes a memory, and wherein the BIST is a memory BIST.

11. The method as recited in claim 9, wherein the integrated circuit includes logic circuitry, and wherein the BIST is a logic BIST.

12. A method for testing an integrated circuit implemented in an electronic system, the method comprising:
- placing one or more functional blocks of the integrated circuit into an offline status, wherein the one or more functional blocks of the integrated circuit includes one or more NMOS (n-channel metal oxide semiconductor) devices;
- setting substrate voltage for the one or more NMOS devices to a first of a plurality of predetermined values;
- conducting a built-in self-test (BIST) on the one or more functional blocks of the integrated circuit;
- recording any failures that occur while performing the BIST;
- repeating said setting, said conducting, and said recording for each remaining one of the plurality predetermined values of the substrate voltage;
- determining a failure rate and a passing range for the BIST for each of the plurality of predetermined values;
- predicting, for each of the plurality of predetermined values, a point in time at which the one or more functional blocks of the integrated circuit will fail based on the failure rates and predetermined optimum operating conditions; and
- further comprising determining at which of the plurality of predetermined values of the substrate voltage the integrated circuit is to operate subsequent to testing, based on the failure rates.

13. The method as recited in claim 12, wherein the integrated circuit includes a memory, and wherein the BIST is a memory BIST.

14. The method as recited in claim 12, wherein the integrated circuit includes logic circuitry, and wherein the BIST is a logic BIST.

* * * * *